United States Patent
Herner et al.

(10) Patent No.: US 6,815,077 B1
(45) Date of Patent: Nov. 9, 2004

(54) LOW TEMPERATURE, LOW-RESISTIVITY HEAVILY DOPED P-TYPE POLYSILICON DEPOSITION

(75) Inventors: S. Brad Herner, San Jose, CA (US); Mark H. Clark, Upland, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/441,601

(22) Filed: May 20, 2003

(51) Int. Cl.[7] .......................... B32B 15/04; B32B 15/08
(52) U.S. Cl. ...................... 428/450; 428/446; 428/704
(58) Field of Search ............................... 428/446, 704, 428/450; 427/255.18

(56) References Cited

U.S. PATENT DOCUMENTS

| | | | |
|---|---|---|---|
| 4,782,465 A | * 11/1988 | Uchida | 365/72 |
| 5,141,892 A | 8/1992 | Beinglass | |
| 5,189,504 A | * 2/1993 | Nakayama et al. | 257/422 |
| 5,389,570 A | * 2/1995 | Shiozawa | 438/243 |
| 6,034,882 A | 3/2000 | Johnson et al. | |
| 6,162,711 A | * 12/2000 | Ma et al. | 438/558 |
| 6,410,090 B1 | * 6/2002 | Wang | 427/255.38 |
| 6,420,215 B1 | 7/2002 | Knall et al. | |
| 6,486,065 B2 | 11/2002 | Vyvoda et al. | |
| 6,486,066 B2 | 11/2002 | Cleeves et al. | |
| 6,495,856 B2 | * 12/2002 | Kikuchi | 257/48 |
| 6,515,888 B2 | 2/2003 | Johnson et al. | |
| 6,525,953 B1 | 2/2003 | Johnson | |
| 6,541,312 B2 | 4/2003 | Cleeves et al. | |
| 6,580,124 B1 | 6/2003 | Cleeves et al. | |
| 6,593,624 B2 | 7/2003 | Walker et al. | |
| 6,624,485 B2 | 9/2003 | Johnson | |
| 6,635,556 B1 | 10/2003 | Herner et al. | |
| 6,649,451 B1 | 11/2003 | Vyvoda et al. | |
| 6,664,639 B2 | 12/2003 | Cleeves | |
| 2001/0035525 A1 | * 11/2001 | Kikuchi | 257/48 |
| 2002/0028541 A1 | 3/2002 | Lee et al. | |
| 2002/0105057 A1 | 8/2002 | Vyvoda et al. | |
| 2003/0021142 A1 | 1/2003 | Knall | |
| 2003/0022526 A1 | 1/2003 | Vyvoda et al. | |
| 2003/0026157 A1 | 2/2003 | Knall et al. | |
| 2003/0155582 A1 | 8/2003 | Mahajani et al. | |
| 2003/0164491 A1 | 9/2003 | Lee | |
| 2003/0173643 A1 | 9/2003 | Herner | |
| 2004/0000679 A1 | 1/2004 | Patel et al. | |
| 2004/0016991 A1 | 1/2004 | Herner et al. | |

FOREIGN PATENT DOCUMENTS

| | | | | |
|---|---|---|---|---|
| JP | 52097690 A | * | 8/1977 | ........... H01L/31/04 |
| JP | 63150944 A | * | 6/1988 | ........... H01L/21/88 |
| JP | 05206146 A | * | 8/1993 | ......... H01L/21/322 |

OTHER PUBLICATIONS

U.S. patent application Ser. No. 10/045,653, Vyvoda et al., filed Nov. 7, 2001.

U.S. patent application Ser. No. 10/185,507, Vyvoda et al., filed Jun. 27, 2002.

U.S. patent application Ser. No. 10/270,309, Vyvoda, filed Oct. 15, 2002.

(List continued on next page.)

Primary Examiner—Stephen J. Stein
(74) Attorney, Agent, or Firm—Pamela J. Squyres (57) ABSTRACT

A method to create a low resistivity P+ in-situ doped polysilicon film at low temperature from $SiH_4$ and $BCl_3$ with no anneal required. At conventional dopant concentrations using these source gases, as deposition temperature decreases below about 550 degrees C., deposition rate decreases and sheet resistance increases, making production of a high-quality film impossible. By flowing very high amounts of $BCl_3$, however, such that the concentration of boron atoms in the resultant film is about $7 \times 10^{20}$ or higher, the deposition rate and sheet resistance are improved, and a high-quality film is produced.

20 Claims, 5 Drawing Sheets

OTHER PUBLICATIONS

U.S. patent application Ser. No. 10/270,394, Vyvoda et al., filed Oct. 15, 2002.

U.S. patent application Ser. No. 10/326,470, Herner et al., filed Dec. 19, 2002.

U.S. patent application Ser. No. 10/611,245, Herner, filed Aug. 30, 2003.

U.S. patent application Ser. No. 10/611,246, Cleeves, filed Jun. 30, 2003.

Haji, L.,et al., "Pressure dependence of in situ boron–doped silicon films prepared by low–pressure chemical vapor deposition. II. Resistivity", *J. Appl. Phys. 66(10), Nov. 15, 1989*, 4812–4817.

Maritan, C.M. ,et al., "Low Pressure Chemical Vapor Deposition of In Situ Boron–Doped Polysilicon", *J. Electrochem. Soc.: Solid–State Science and Technology*, (Jul. 1988), 1793–1796.

Nakayama, Satoshi., et al., "Boron Doping Effect on Silicon Film Deposition in the $Si_2H_6$–$B_2H_6$–He Gas System", *J. Elecrochem.Soc.: Solid–State Science and Technology*, (Aug. 1986), 1727–1724.

Shiozawa, Jun–Ichi.,et al. , "The Formation of BoronDoped Polycrystalline Si with Extremely Low Resistivites at Low Temperatures", *J. Electrochem. Soc., vol. 141, No. 5, May 1994*, 1334–1338.

\* cited by examiner

LOW TEMPERATURE, LOW-RESISTIVITY HEAVILY DOPED P-TYPE POLYSILICON DEPOSITION

BACKGROUND OF THE INVENTION

The invention relates to a method of depositing doped polycrystalline silicon, hereinafter referred to as polysilicon, at low temperature.

Thin doped polysilicon films are typically deposited at temperatures between 540 and 625 degrees C. by low pressure chemical vapor deposition (LPCVD.) Alternatively, an amorphous silicon film can be deposited at lower temperatures with dopants, then annealed after deposition at temperatures of 550 degrees C. or greater to crystallize the silicon and activate the dopants. In general, as deposition temperature drops, the deposition rate and quality of doped polysilicon films decreases.

The temperatures required to create doped polysilicon films using conventional methods are incompatible with other processes and materials that may be desirable. For example, aluminum metallization withstands a maximum practical fabrication temperature of only 475 degrees C. for semiconductor processing.

Ishihara, U.S. Pat. No. 5,956,602, "Deposition of Polycrystal Si Film," discloses a method to deposit a doped polysilicon film at temperatures below 500 degrees C. This method introduces a source gas like $SiH_4$ and a dopant gas such as $BCl_3$, $PH_3$, or $Al(CH_3)_3$. The two gases are flowed at different times, without overlapping. Hydrogen plasma is then used to anneal the film. The process is repeated until a film of the desired thickness is produced.

While this method claims to produce doped polysilicon at temperatures below 500 degrees C., it has disadvantages. Repeatedly introducing the source and dopant gases at different times and annealing with hydrogen plasma involves significant process complexity and requires specialized equipment. Further, alternately introducing the silicon and dopant source gases may result in dopant nonuniformities throughout the film.

There is a need, therefore, to create high-quality doped polysilicon films at temperatures less than those used in conventional processes and that do not require a subsequent high temperature anneal. It would be preferable if complex deposition cycles and specialized equipment are not required.

SUMMARY OF THE INVENTION

The present invention is defined by the following claims, and nothing in this section should be taken as a limitation on those claims. In general, the invention is directed to a method to deposit low-resistivity doped polysilicon at low temperatures.

According to one aspect of the invention, a method for depositing a doped polysilicon film comprises providing a surface and substantially simultaneously flowing $SiH_4$ and $BCl_3$ over the surface at a temperature less than or equal to about 500 degrees Celsius under conditions that achieve an average concentration in the doped polysilicon film of between about $7 \times 10^{20}$ and about $3 \times 10^{21}$ boron atoms per cubic centimeter.

According to another aspect of the invention, a method for forming in-situ doped polysilicon comprises providing a surface and substantially simultaneously flowing a first source gas comprising $SiH_4$ and a second source gas comprising $BCl_3$ over the surface at a temperature less than about 500 degrees Celsius under conditions sufficient to achieve in the doped polysilicon an average concentration of between about $7 \times 10^{20}$ and about $3 \times 10^{21}$ boron atoms per cubic centimeter.

A related embodiment provides for a semiconductor device comprising in-situ doped polysilicon formed by a method comprising providing a surface, and substantially simultaneously flowing $SiH_4$ and $BCl_3$ over the surface at a temperature less than about 500 degrees Celsius, wherein an average concentration of boron atoms in the polysilicon of between about $7 \times 10^{20}$ and about $3 \times 10^{21}$ per cubic centimeter is achieved.

Another related embodiment provides for a monolithic three dimensional memory comprising polysilicon formed by a method comprising substantially simultaneously flowing $SiH_4$ and $BCl_3$ at a temperature less than or equal to about 500 degrees Celsius, wherein an average concentration of boron atoms in the polysilicon is between about $7 \times 10^{20}$ and about $3 \times 10^{21}$ per cubic centimeter, wherein the monolithic three dimensional memory comprises two or more memory levels.

A preferred embodiment provides for a method for depositing in-situ doped polysilicon, the method comprising providing a surface comprising a substantially horizontal surface and a substantially vertical sidewall descending from the horizontal surface, the sidewall having a top, and depositing an in-situ doped polysilicon film on the surface at a temperature less than about 500 degrees Celsius, wherein a first thickness of the film at its thinnest point on the vertical sidewall is at least 80 percent of a second thickness of the film on the sidewall at the top of the sidewall, and a third thickness of the film on the horizontal surface is at least 200 angstroms.

Another preferred embodiment provides for an in-situ doped polysilicon film wherein the polysilicon film was deposited at a temperature less than about 500 degrees Celsius, and the polysilicon film is deposited by substantially simultaneously flowing a first source gas comprising $SiH_4$ and a second source gas comprising $BCl_3$, wherein the polysilicon film has a sheet resistance less than about 280 ohms/square.

Other preferred embodiments are provided, and each of the preferred embodiments can be used alone or in combination with one another.

The preferred embodiments will now be described with reference to the attached drawings.

DETAILED DESCRIPTION OF THE INVENTION

A challenge of semiconductor device design is to select materials that are thermally compatible. If a deposition or anneal process requires high temperatures, other materials already present must be compatible with those temperatures.

Doped polysilicon has many uses in the semiconductor industry. For many designs and devices, it would be advantageous to deposit a low-resistance doped polysilicon film with good step coverage at low temperature. Specifically, it would be useful to form a low-resistance doped polysilicon film with good step coverage at temperatures below about 500 degrees. Aluminum wiring is used in many integrated circuit designs, but when used with doped polysilicon, the aluminum can only be deposited after the doped polysilicon is deposited and in a low resistivity state, since aluminum will soften and/or extrude at temperatures above about 475 degrees C., making practical semiconductor fabrication difficult. Thus even lower temperatures for deposition of doped polysilicon, for example about 475 degrees and below, would also highly advantageous. By employing methods according to the present invention, aluminum wiring, for example, could be formed before doped polysilicon deposition, then low-resistance doped polysilicon formed later, at temperatures low enough to avoid damaging the aluminum structures.

At about 550 degrees C., heavily doped p-type (P+) deposited silicon doped in situ (by providing dopant atoms during deposition, rather than by implanting them later) is polycrystalline and conductive and has low resistivity. This is in contrast to heavily doped n-type silicon, which tends to be amorphous at this deposition temperature, and must be annealed at a temperature of, for example, about 550 degrees C. or greater to crystallize the silicon and render it conductive.

Figure 1A:
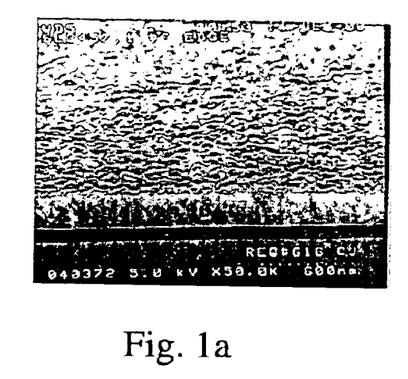
FIGS. 1a through 1c illustrate decreasing quality of P+ polysilicon film at progressively lower deposition temperatures.
Figure 1B:
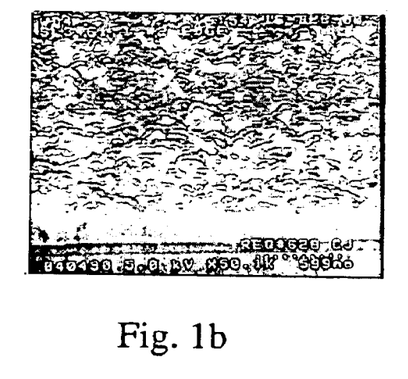
Figure 1C:
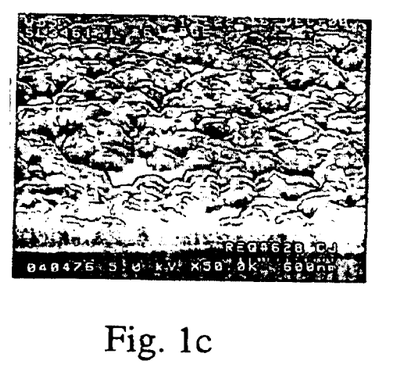

As temperature falls below 550 degrees C., however, the rate of deposition of P+ polysilicon generally decreases and the quality of the film begins to degrade. FIG. 1a is a scanning electron microscope image of a high-quality P+ polysilicon film 200 nm thick deposited by flowing $SiH_4$, $BCl_3$ and helium at 550 degrees C. In FIG. 1b, at a temperature of 500 degrees C., it can be seen a 200 nm thick film is rougher; this film will have higher resistivity. FIG. 1c shows a 200 nm thick P+ polysilicon film deposited at 460 degrees C. This film is very rough and discontinuous and would not be suitable for uses requiring a conductive film. In FIGS. 1a, 1b, and 1c, the concentration of boron atoms (a p-type dopant) in the polysilicon film is $2 \times 10^{20}$ atoms/cm$^3$, a fairly typical dopant concentration for heavily doped polysilicon.

Figure 2:
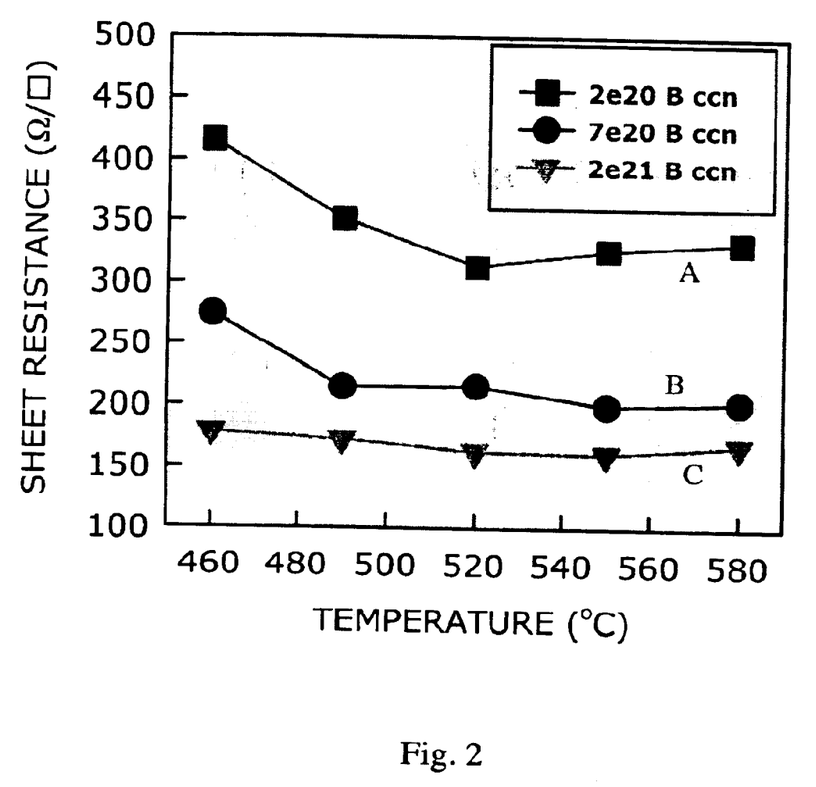
FIG. 2 is a graph showing sheet resistance of polysilicon films vs. deposition temperature for different dopant concentrations.

FIG. 2 shows sheet resistance for P+in-situ doped polysilicon films deposited at different temperatures. It will be seen on curve A that for boron concentrations of $2 \times 10^{20}$ atoms/cm$^3$, sheet resistance generally increases as deposition temperature decreases. In some applications the lowest possible sheet resistance is advantageous for device performance.

Deposition of P+ polysilicon has been achieved at low temperatures using $Si_2H_6$ and $B_2H_6$ as source gases, but there are disadvantages associated with use of these source gases. $B_2H_6$ tends to dope surfaces nonuniformly. Dopant concentration thus tends to be highly nonuniform across the wafers in a reactor, and even across each wafer. Better uniformity is achieved using $B_2H_6$ at lower temperatures. However, at lower deposition temperatures, films deposited using $Si_2H_6$ and $B_2H_6$ are amorphous. Amorphous films require a high temperature anneal to make the film conductive. Further, $Si_2H_6$ is less commonly used in semiconductor fabrication than is $SiH_4$, and thus more expensive and less readily available.

It has largely been assumed that low-temperature deposition of P+ polysilicon using $SiH_4$ and $BCl_3$ without use of hydrogen plasma anneal or complex deposition cycles is impractical. The present application discloses, however, that by flowing very high amounts of $BCl_3$ with $SiH_4$, the deposition rate and film quality of P+ polysilicon at low temperatures can be significantly improved.

Briefly, by providing a surface and substantially simultaneously flowing $SiH_4$ and $BCl_3$ over the surface at a temperature less than or equal to 500 degrees Celsius, under conditions that achieve an average concentration in the doped polysilicon film of between about $7 \times 10^{20}$ and about $3 \times 10^{21}$ boron atoms/cm$^3$, a polysilicon film having a sheet resistance less than about 280 ohms per square can be achieved. Referring again to FIG. 2, it will be seen that at deposition temperature below 500 degrees, even as low as 460 degrees, the sheet resistance for a film with a boron concentration of $7 \times 10^{20}$ atoms/cm$^3$ (as shown on curve B) ranges between about 200 and below about 280 ohms/square.

As FIG. 2 shows, for concentrations of $2 \times 10^2$ and $7 \times 10^{20}$ boron atoms/cm$^3$, sheet resistance generally increases with decreasing deposition temperature below about 520 degrees Celsius. It is suspected that this increase may be due to decreased activation of the dopant.

Figure 3:
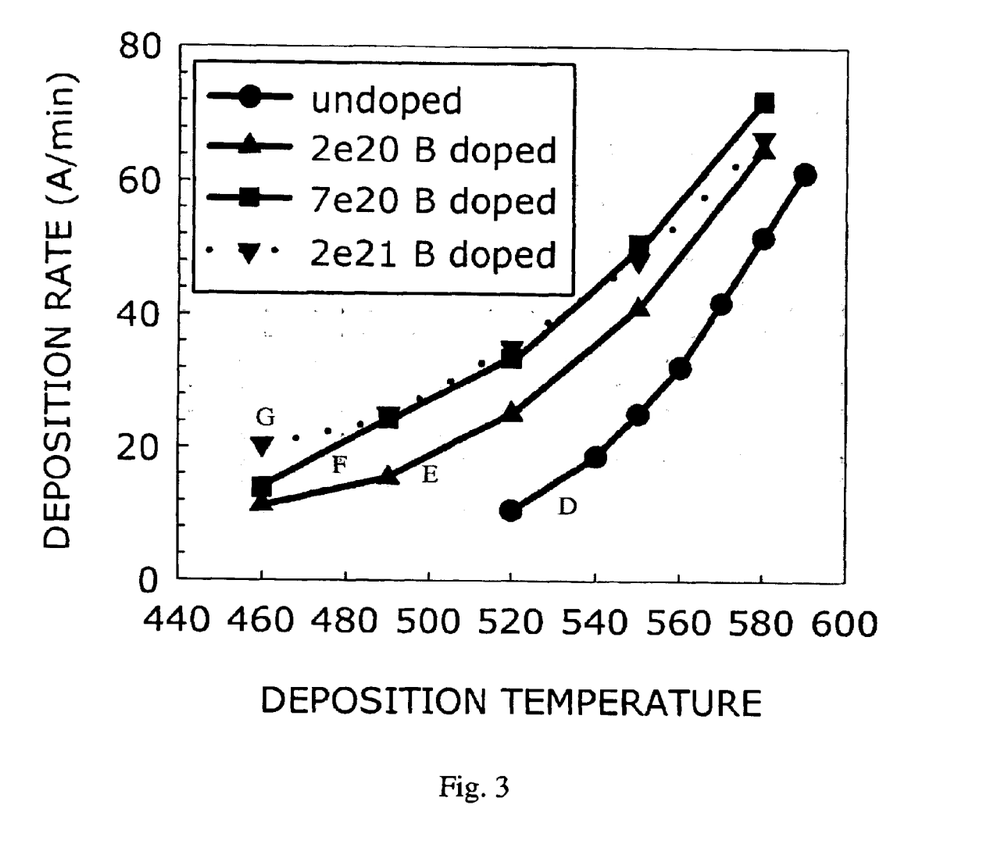
FIG. 3 is a graph showing deposition rate in angstroms per minute vs. deposition temperature for different dopant concentrations.

FIG. 3 is a graph showing deposition rate of silicon in angstroms per minute at various deposition temperatures. Curve D shows deposition rates for undoped silicon, curve E for in-situ doped silicon with an average dopant concentration of $2 \times 10^{20}$ boron atoms/cm$^3$, curve F for in-situ doped silicon with an average dopant concentration of $7 \times 10^2$ boron atoms/cm$^3$, and curve G for in-situ doped silicon with an average dopant concentration of $2 \times 10^{21}$ boron atoms/cm$^3$. For all curves, the source gas providing silicon was $SiH_4$; in the doped cases, the source gas providing boron atoms comprised $BCl_3$. The gases were flowed substantially simultaneously. Helium was used to dilute $BCl_3$ and as a mixing gas for $SiH_4$ and $BCl_3$.

It will be seen that at a given temperature, the deposition rate generally increases as the dopant concentration increases.

Deposition for the points shown on curves D, E, F, and G took place at 400 mTorr. $SiH_4$ was flowed at 500 standard cubic centimeters per minute (sccm) and helium, an inert gas, at 700 sccm. For the depositions on curve E, in which the average dopant concentration was $2 \times 10^{20}$ boron atoms/cm$^3$, 0.5 percent $BCl_3$ (balance helium) was flowed substantially simultaneously in addition to the $SiH_4$ and helium. For the depositions on curve F and G, in which the average dopant concentrations were $7 \times 10^{20}$ boron atoms/cm$^3$ and $2 \times 10^{21}$ boron atoms/cm$^3$ respectively, 1.5 percent $BCl_3$ (balance helium) was flowed substantially simultaneously in addition to the $SiH_4$ and helium.

Preferred embodiments of the present invention will now be described in more detail.

In a preferred embodiment, a substrate having a surface is placed in a reactor. P+ polysilicon formed according to the present invention may be deposited on any material to which it adheres, for example silicon dioxide. At temperatures less than or equal to about 500 degrees C., source gases $SiH_4$ and $BCl_3$ are substantially simultaneously flowed over the surface under conditions sufficient to achieve in the doped polysilicon an average concentration of between about $7 \times 10^{20}$ and about $3 \times 10^{21}$ boron atoms/cm$^3$.

The temperature during deposition is preferably between about 450 and about 480 degrees, more preferably between about 460 and 475 degrees.

Many possible flow conditions will produce in-situ doped polysilicon of the named dopant concentrations. Pressure is preferably between about 200 mTorr and about 1 Torr, more preferably about 400 mTorr. Above about 1 Torr, the risk of gas-phase nucleation increases, which will prevent formation of a satisfactory film, though the risk decreases with lower temperature.

At least two source gases will be substantially simultaneously flowed. For two or more gases to be "substantially simultaneously" flowed means that the gases are flowed at the same time during the deposition, the flows overlapping. It is not essential that the flows of both gases start or end at the same instant. The first source gas comprises $SiH_4$. Preferably the first source gas is $SiH_4$. In a preferred embodiment, $SiH_4$ is flowed at about 400 sccm.

Using conventional equipment, very low flows of gas can be difficult to control. The second gas could be pure $BCl_3$, but to improve uniformity and flow control, the second gas is preferably $BCl_3$ mixed with an inert gas, such as helium, argon, or nitrogen; preferably helium. The second source gas thus comprises $BCl_3$. The second source gas may also comprise an inert gas, which may be helium. The percentage of $BCl_3$ in the second source gas may be as low as 0.1 percent. In a preferred embodiment, a mixture of about 1.5 percent $BCl_3$ and the balance helium is flowed at about 10 sccm.

As noted, the flows, temperature, and the concentrations of $SiH_4$ (in the first source gas) and $BCl_3$ (in the second source gas) should be selected to achieve a concentration of boron atoms in the polysilicon film averaging between about $7 \times 10^{20}$ and about $3 \times 10^{21}$ boron atoms/cm$^3$.

The following table details flow of $BCl_3$ in sccm used to deposit doped polysilicon at concentrations of $7 \times 10^{20}$ boron atoms/cm$^3$ and at $2 \times 10^{21}$ boron atoms/cm$^3$ for different deposition temperatures:

| Deposition Temperature degrees C | 1.5% $BCl_3$ sccm, ccn = 7 × 10$^{20}$/cm$^3$ | 1.5% $BCl_3$ sccm, ccn = 2 × 10$^{21}$/cm$^3$ |
| --- | --- | --- |
| 460 | 10 | 20 |
| 490 | 18 | 36 |
| 520 | 34 | 68 |
| 550 | 62 | 124 |
| 580 | 114 | 228 |

In general, as temperature drops, more boron atoms will be incorporated, so the skilled practitioner will adjust other aspects of deposition conditions, including flows, concentrations, and pressures, accordingly, as a matter of routine experimentation.

In addition to the first source gas comprising $SiH_4$ and the second source gas comprising $BCl_3$, flowing an inert gas, such as helium, argon, or nitrogen, can improve mixing and lead to more uniform dopant concentrations across a wafer and across wafers in a reactor. In a preferred embodiment, helium is flowed at about 700 sccm.

More generally, the concentration of boron atoms in the film is correlated with the ratio of $SiH_4$ to $BCl_3$. To increase the concentration of boron atoms in the film, for example, the skilled practitioner will change the ratio by decreasing $SiH_4$ (by decreasing concentration or flow) or increasing $BCl_3$ (by increasing concentration or flow.)

Preferred embodiments of P+ polysilicon deposited according to the method of the present invention provide an additional advantage in that such polysilicon has excellent step coverage. It is common in semiconductor processing to coat uneven surfaces with a deposited layer. If a material has good step coverage, it can be deposited over uneven surfaces, for example over trenches, and will cover horizontal surfaces at the top and bottom of the trenches, and vertical sidewalls of trenches, with a substantially uniform thickness.

Figure 4A:
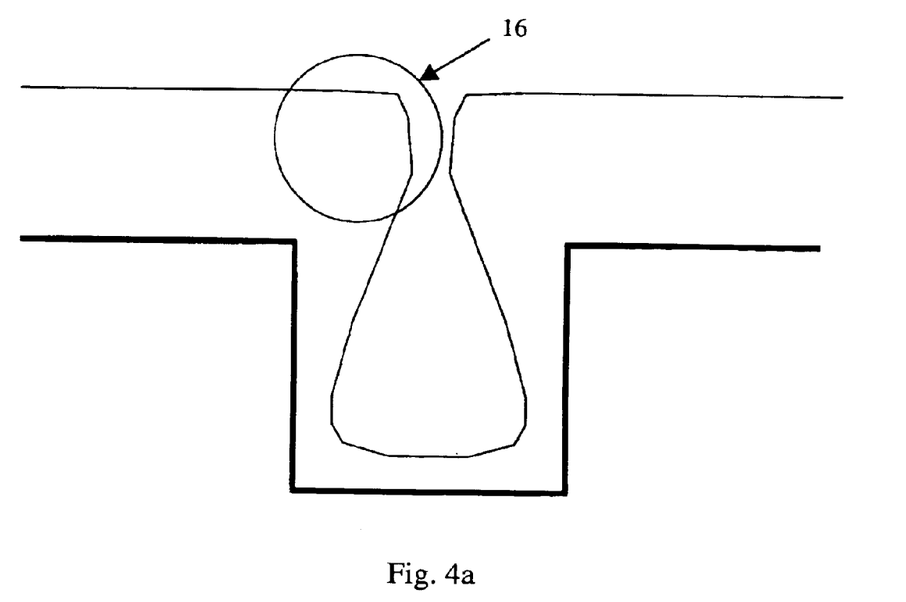
FIGS. 4a through 4c illustrate film step coverage over uneven surfaces.

Poor step coverage can make it difficult or impossible to fill a high-aspect ratio trench or via. As shown in FIG. 4a, during chemical or vapor deposition an overhang 16 may form at the opening of the trench. This results in a shadowing effect, sheltering the lower sidewalls and bottom of the via from further deposition and causing a void if the lip "pinches off" and closes.

Figure 4B:
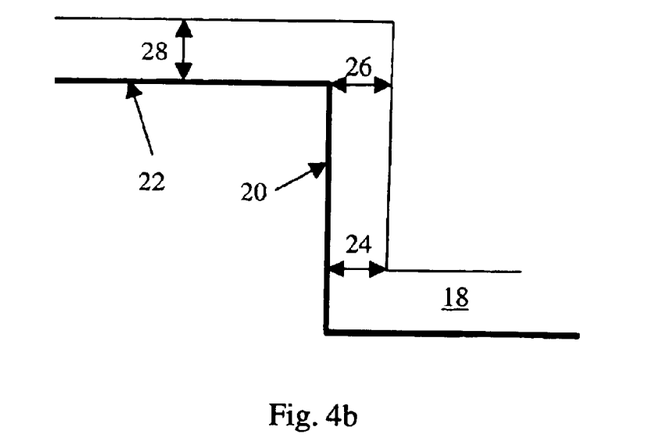
Figure 4C:
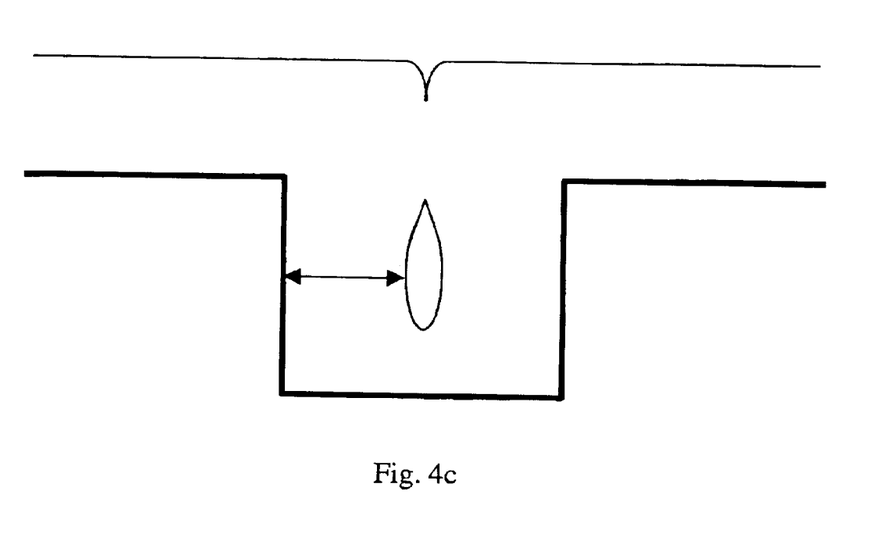

As shown in FIG. 4b, in-situ doped polysilicon formed according to the present invention can be deposited with good sidewall and bottom coverage, and without tending to pinch off and form voids if deposited over a trench, by avoiding formation of a significant overhang. Specifically, for a P+ polysilicon film 18 formed according to the present invention, at temperatures below about 500 degrees, deposited over a substantially vertical sidewall 20 descending from a substantially horizontal surface 22, the thickness 24 at its thinnest point on sidewall 20 of the film 18 will be at least 80 percent of the thickness 26 of film 18 on the sidewall 20 at the top of the sidewall, when thickness 28 of the film 18 on horizontal surface 22 is at least 200 angstroms. Thickness here is presumed to be measured perpendicular to the sidewall or surface, whichever is named. If the level of fill is above the top of the sidewall, then the thickness at the thinnest point will be the same as the thickness at the top of the sidewall, unless there are any voids; in this case the thinnest point will be measured from the void, as in FIG. 4c. Overhang is undesirable whether or not the vertical sidewall is a trench sidewall.

In-situ doped polysilicon formed according to the present invention can be used in any semiconductor devices or arrays of devices, including memory arrays, that are advantageously formed at low temperature. Examples of such devices include, but are not limited to, logic or memory devices, transistors formed in monocrystalline silicon, thin-film transistors (in which polysilicon could form a portion of a channel), capacitors, resistors, inductors, diodes, interconnects, PROMs, EPROMs, and EEPROMS. One such semiconductor device may comprise portions of a diode separated by an antifuse which become a diode when the antifuse is ruptured. Arrays of such devices include, but are not limited to, two dimensional and monolithic three dimensional arrays.

P+ polysilicon formed according to the present invention could be advantageously used in monolithic three dimensional memories such as those described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420,215, "Three Dimensional Memory Array and Method of Fabrication"; Lee et al., U.S. patent application No. 09/927,648, "Dense Arrays and Charge Storage Devices, and Methods for Making Same," filed Aug. 13, 2001; and Herner et al., U.S. patent application Ser. No. 10/326,470, "An Improved Method for Making High-Density Nonvolatile Memory," filed Dec. 19, 2002, all hereby incorporated by reference. P+ polysilicon formed according to the present invention can be used whenever P+ or doped polysilicon is called for in any of the patents or applications name herein.

Monolithic three dimensional memories present particular challenges for temperature compatibility of processing. In simpler, conventional two dimensional structures (without stacked memory levels), it's possible to combine doped polysilicon, requiring temperatures over 550 degrees C., and aluminum, requiring temperatures not exceeding 475 degrees C., if the doped polysilicon is formed at higher temperatures first, then aluminum metallization is formed later.

In contrast, in monolithic three dimensional memories, a memory level, including all of its associated metallization, is formed, and then another memory level is formed above it. This means that all elements of a memory level (including, for example, aluminum metallization) are subjected to the temperatures required to form every element (including, for example, low-resistance polysilicon) of the next level. Low-temperature formation of low-resistance polysilicon in one memory level offers the advantage that it does not damage aluminum metallization, or other structures with low temperature tolerances, that already exist in a previously-formed level. Thus a low-temperature method to form in-situ doped polysilicon can be particularly useful in monolithic three-dimensional memories.

EXAMPLE

In one example, P+ polysilicon according to the present invention was formed on silicon wafers in an ASML RVP 9000. The ASML RVP 9000 has a capacity of 176 wafers. Every other slot was filled, so 88 wafers were used at an effective pitch of 8.6 mm. Of these 88 wafers, only 75 were product wafers, centered vertically; the rest were dummy wafers. The product wafers had previously had a layer of oxide deposited on them, and P+ polysilicon was deposited on the oxide. The remainder of the wafers were dummy wafers coated with a protective silicon nitride film to prevent breakage, as described in Herner et al., "Dummy Wafers and Methods for Making the Same," U.S. patent application No. 10/036,291, filed Nov. 7, 2001, hereby incorporated by reference. The pressure was stabilized at 400 mTorr and the temperature at 460 degrees c. $SiH_4$ was flowed at 500 sccm, helium was flowed at 700 sccm, and 1.5 percent $BCl_3$ (balance helium) was flowed at 10 sccm to deposit 2000 angstroms of P+ polysilicon.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A semiconductor device comprising in-situ boron doped polysilicon formed by a method comprising:
   providing a surface over a substrate wherein aluminum exists at or below the surface and above the substrate; and
   forming an in-situ boron doped polysilicon film on the surface by
   substantially simultaneously flowing $SiH_4$ and $BCl_3$ over the surface at a temperature less than about 500 degrees Celsius, wherein the film has an average concentration of boron atoms in the polysilicon of between about $7\times10^{20}$ and about $3\times10^{21}$ per cubic centimeter, wherein the aluminum is between the polysilicon film and the substrate.

2. The semiconductor device of claim 1 wherein the temperature is between about 450 and about 480 degrees Celsius.

3. The semiconductor device of claim 2 wherein the device is a thin film transistor.

4. The semiconductor device of claim 3 wherein the polysilicon film forms a portion of a channel of the thin film transistor.

5. The semiconductor device of claim 2 wherein the device comprises a portion of a diode.

6. The semiconductor device of claim 2 wherein the pressure is between about 200 mTorr and about 1 Torr.

7. A monolithic three dimensional memory comprising:
   aluminum; and
   in-situ boron doped polysilicon formed after formation of the aluminum by a method comprising:
      substantially simultaneously flowing SiH4 and $BCl_3$ at a temperature less than or equal to about 500 degrees Celsius, wherein an average concentration of boron atoms in the polysilicon is between about $7\times10^{20}$ and about $3\times10^{21}$ per cubic centimeter, wherein the monolithic three dimensional memory comprises two or more memory levels.

8. The memory of claim 7 wherein the temperature is between about 450 and about 480 degrees Celsius.

9. The memory of claim 8 wherein the pressure is between about 200 mTorr and about 1 Torr.

10. The memory of claim 9 wherein the $BCl_3$ is provided in a source gas, and is 1.5 percent of the source gas.

11. A device comprising:
    at least one memory level,
    a substrate:
    aluminum; and
    an in-situ boron-doped polysilicon film wherein:
       the polysilicon film was deposited at a temperature less than about 475 degrees Celsius; and
       the polysilicon film is was deposited by substantially simultaneously flowing a first source gas comprising $SiH_4$ and a second source gas comprising $BCl_3$,
       and wherein the aluminum is between the polysilicon film and the substrate, and
       wherein an average concentration of boron atoms in the polysilicon film is between about $7\times10^{20}$ and $3\times10^{21}$ per cubic centimeter.

12. The device of claim 11 wherein the polysilicon film is deposited by substantially simultaneously flowing a first source gas comprising $SiH_4$ and a second source gas comprising $BCl_3$.

13. The device of claim 12 wherein the termperature is between about 450 and about 480 degrees Celsius.

14. The device of claim 13 wherein an average concentration of boron atoms in the polysilicon film is between $7\times10^{20}$ and $3\times10^{21}$ per cubic centimeter.

15. The device of claim 14 wherein the second source gas further comprises an inert gas.

16. The device of claim 15 wherein the inert gas is helium.

17. The device of claim 11 wherein $BCl_3$ is about 1.5 percent of the second source gas.

18. The semiconductor device of claim 1 wherein the aluminum is aluminum metallization.

19. The memory of claim 7 further comprising aluminum metallization, the aluminum metallization comprising the aluminum.

20. The device of claim 11 wherein the aluminum is aluminum metallization.

* * * * *